United States Patent [19]

Harrington

[11] 4,348,642
[45] Sep. 7, 1982

[54] FEEDFORWARD WIDEBAND AMPLIFIER

[75] Inventor: Timothy A. Harrington, Cedar Rapids, Iowa

[73] Assignee: Rockwell International Corporation, El Segundo, Calif.

[21] Appl. No.: 182,533

[22] Filed: Aug. 29, 1980

[51] Int. Cl.³ .............................................. H03F 1/26
[52] U.S. Cl. ..................................... 330/149; 330/151
[58] Field of Search .................... 330/124 R, 149, 151

[56] References Cited

U.S. PATENT DOCUMENTS 3,667,065  5/1972  Beurrier et al. ................ 330/151 X
4,130,807  12/1978  Hall et al. ...................... 330/151 X

OTHER PUBLICATIONS

Hsieh et al., "A Feedforward S-Band MIC Amplifier System", *IEEE Journal of Solid-State Circuits*, vol. SC-11, No. 2, Apr. 1976, pp. 271-278.

Primary Examiner—James B. Mullins
Attorney, Agent, or Firm—Richard K. Robinson; Howard R. Greenberg; H. Fredrick Hamann

[57] ABSTRACT

The performance of a wide band feedforward power amplifier circuit is enhanced when a phase intercept distortion compensation circuit is used to provide phase and amplitude matching between the signal amplifier and the feedforward path.

6 Claims, 3 Drawing Figures

FEEDFORWARD WIDEBAND AMPLIFIER

BACKGROUND OF THE INVENTION

This invention relates to feedforward amplifier circuits.

Feedforward amplifier circuits are well known in the art, an example of which may be viewed by referring to FIG. 1, a schematic diagram of a prior art, wide-band, feedforward amplifier circuit. An input signal such as a radio frequency signal is applied to the feedforward amplifier circuit at terminal 1 which is connected to the directional coupler 3 at terminal A. In some embodiments, the signal that is present on the output terminal B of the directional coupler 3 is attenuated by the coupler by a selected amount such as 10 or 30 DB. Terminal A' is the remaining output terminal and the signal on Terminal A' is supplied to the power amplifier 5 which in the case of most feedforward circuits is a wide-band power amplifier. The directional coupler 3, due to its inherent capabilities, essentially samples the signal that is present on terminal A and provides a sample signal to the delay line 6 and the comparator 9. The comparator 9 compares the delayed sampled signal that is present on terminal D with an amplified representation of that signal that has been amplified by the amplifier 5 and sampled by the directional coupler 7 which is similar to the directional coupler 3 and obtains the difference of the signal that is on terminal E of the directional coupler 7 and the delayed signal that was delayed by the delay line 6 that is present on terminal D, the negative terminal of the comparator 9. The difference that is on the Δ terminal of the comparator 9 is amplified by the error amplifier 13 and applied to the terminal H of the directional coupler 15 which is used as a recombiner for recombining with the signal that is present on the terminal G the signal that is present on terminal H. The signal present on terminal G is the amplifier signal that was amplified by amplifier 5, sampled by directional coupler 7 and delayed by delay 11. The recombined output signal is present on terminal I of the directional coupler 15 and is connected by way of terminal 2 to load 17.

The attenuation factors and delay characteristics of the directional couplers 3 and 7 and delay 6 are selected such that the amplitude and phase of the input signal components on the + and − terminals of the comparator 9 are equal, rendering only distortion components at the Δ terminal of comparator 9. Similarly, the attenuation factors and delay characteristics of the directional couplers 7 and 15 and delay 11 are selected to completely null the distortion components introduced by amplifier 5 and amplified by the error amplifier 13 so that the output signal at Terminal I does not have any distortion components as a result of amplication by the amplifier 5.

The mathematical derivation of the operation of the prior art circuit is provided in the Table of Equations by Equations 1 through 12. The voltage signals at the terminals are given the terminal letter as a subscript. The input signal that is applied to terminal 1 and terminal A is denoted $V_A$ and is mathematically represented in Equation 1. K is a constant and $\omega$ represents the radian frequency of the signal that is applied to terminal 1. The signal that is present on terminal B of the directional coupler 3 is represented by Equation 2. In this equation, $\alpha_1$ is the attenuation factor introduced to the circuit by the directional coupler 3. In the equation representing the amplified signal $V_C$, equation 3, $G_1$ is the gain of the amplifier 5, and has included therein the equivalent distortion voltage $D_{V_1}$ which represents the distortion components injected into the system by the power amplifier 5 and $T_1$ is the delay through amplifier 5. The delayed signal that is applied to the summing device 9 on the negative terminal D is represented by Equation 4 with $\alpha_3$ being the attenuation provided by the delay 6 and $T_2$ being the time delay provided by the delay 6. The sample of the amplified signal that is present on terminal E of the directional coupler 7 is provided by Equation 5 where $\alpha_2$ is the attenuation factor of the directional coupler 7. The signal that is applied to the error amplifier 13 is represented by Equation 6 with $\alpha_5$ being the attenuation of the comparator 9. The expansion of Equation 6 is provided in Equation 7.

The recombination of the signals as mentioned earlier is provided by the directional coupler 15. Equation 8 is the mathematical representation of the signal that is present on terminal G where an additional time delay $T_3$ and attenuation $\alpha_4$ is provided as a result of signal propogation through the delay 11.

The output of the error amplifier is represented by Equation 9 which is the difference between Equations 4 and 5 amplified by the error amplifier 13 with the $G_2$ being the gain of amplifier 13 and $T_4$ being the propogation delay of the signal by amplifier 13, and $D_{V_2}$ being the distortion components generated by amplifier 13. The mathematical recombination of the signal is provided by Equation 10 with $V_I$ being the signal that is present on terminal I of the directional coupler 15 and $\alpha_6$ is the attenuation factor injected on the signal by the directional coupler 15. Equation 11 is the expansion of equation 10.

The selection of the directional couplers and delay lines as was discussed above are such that $T_3 = T_4$ and $\sqrt{\alpha_4} = \sqrt{\alpha_2 \alpha_5} \, G_2$ then equation 11 may be simplified so that the distortion from amplifier 5, $D_{V_1}$ is cancelled and equation 12 represents the output signal at Terminal I.

It should be noted that the distortion component from the error amplifier $D_{V_2}$ is considerably less than the distortion level of power amplifier 5. In the situation where $D_{V_2}$ is beyond acceptable limits than prior art circuits are known in which feedforwarding techniques are used to reduce the $D_{V_2}$ component.

In theory, an arbitrary high amount of correction can be applied using the above described feedforward system. The phase and gain matching requirements for achieving and maintaining a high level of distortion is generally prohibitive. The prior art has used multi-stage feedforward corrections where there is feedforward correction of the error amplifier 13. It is obvious that this technique may be extrapolated on down through multi-stages. However, the cost becomes prohibitive when multi-stage feedforward circuits are used.

SUMMARY OF THE INVENTION

The implementation of feedforward error correction over broad bandwidths requires careful amplitude and phase matching. The use of distributed delay lines, such as coaxial cables, are desirable due to their extreme linear phase characteristic with frequency. FIG. 2 to which reference should now be made, is a graph of frequency versus phase characteristics for a distributed delay line represented by curve 43 and a power amplifier represented by curve 45. These characteristic curves intersect the phase axis at the origin which is characteristic of any low pass structure. The delay or length of the coaxial cable determines the slope of the phase characteristics, but the phase intercept as shown in FIG. 2 is always 0. Although the main amplifier, which is a bandpass structure, also exhibits a 0 phase intercept, curve 47, the extrapolation of the linear phase region to zero frequency will intercept the phase axis at some non-0 value, point 51, which is represented by an X degrees differential phase shift as shown by arrows 49. Since this linear phase region is also the regin over which the phase matching must occur (i.e., the passband of the amplifier), the amplifier behaves as though it has a non-0 phase intercept. Therefore, although a delay line can be constructed which has the same slope as the amplifier's characteristics, a constant phase difference will occur between the amplifier characteristics and the delay line characteristic in the power amplifier's passband and thus degrade the performance of the circuit.

The performance of a wide band feedforward power amplifier circuit is enhanced when a phase intercept distortion compensation circuit is used to provide phase and amplitude matching between the signal amplifier and the feedforward path.

The phase intercept distortion compensation network provides for performing a Hilbert's transform on the input signal so that the input signal is separated into two components with a fixed 90° phase relationship with each other. A quadrature hybrid was selected for its ability to separate the input signal into the two components with the output having a fixed 90° phase relationship. The two quadrature signals with the appropriate amplitudes and polarities are recombined such that any phase relationship can be selectively obtained from 0 to $2\pi$ radians. The network also performs the input sampling function which yields two signals of approximate equal amplitudes but with a constant phase relationship between each other across the passband of the feedforward amplifier circuit.

Many advantages of the present inventio may be acertained from a reading of the specification and the claims in conjunction with the drawings.

DETAILED DESCRIPTION OF THE PREFERRED EMBODIMENT

Figure 1:
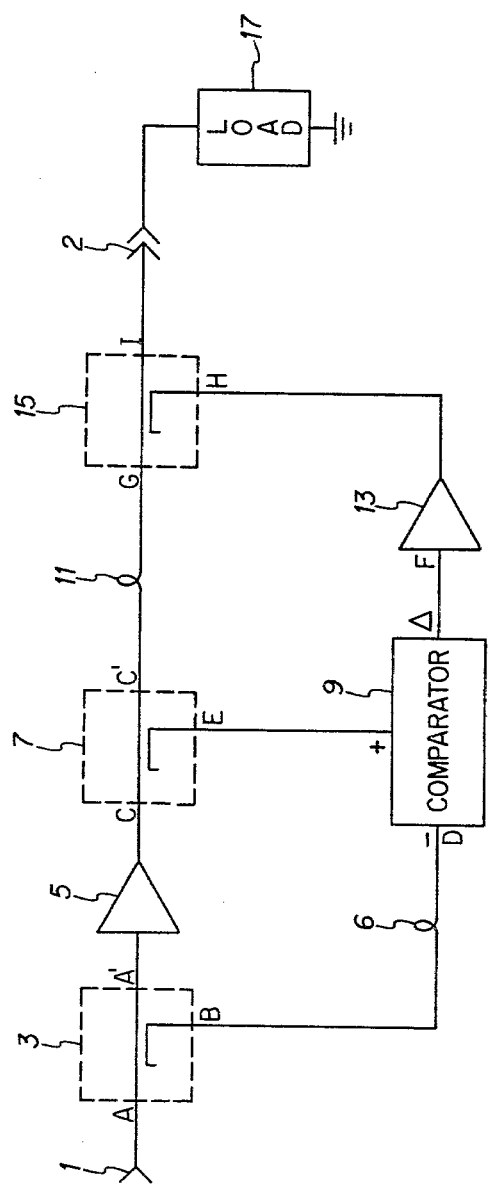
FIG. 1 is a simplified schematic diagram of the prior art feedforward amplifier circuit.
Figure 2:
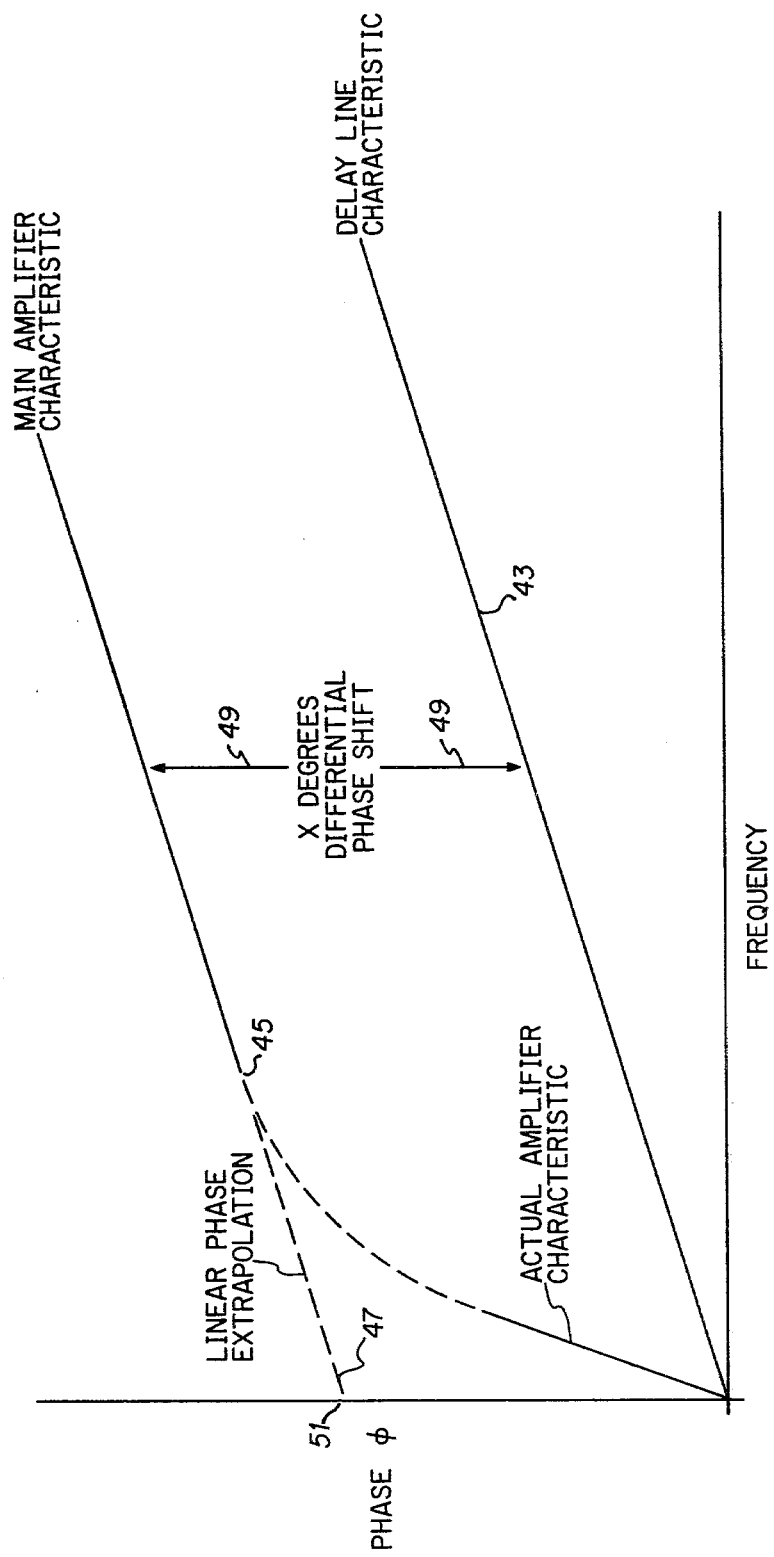
FIG. 2 is a graph illustrating the frequency and phase characteristics of a distributed delay line and a typical broadband power amplifier.
Figure 3:
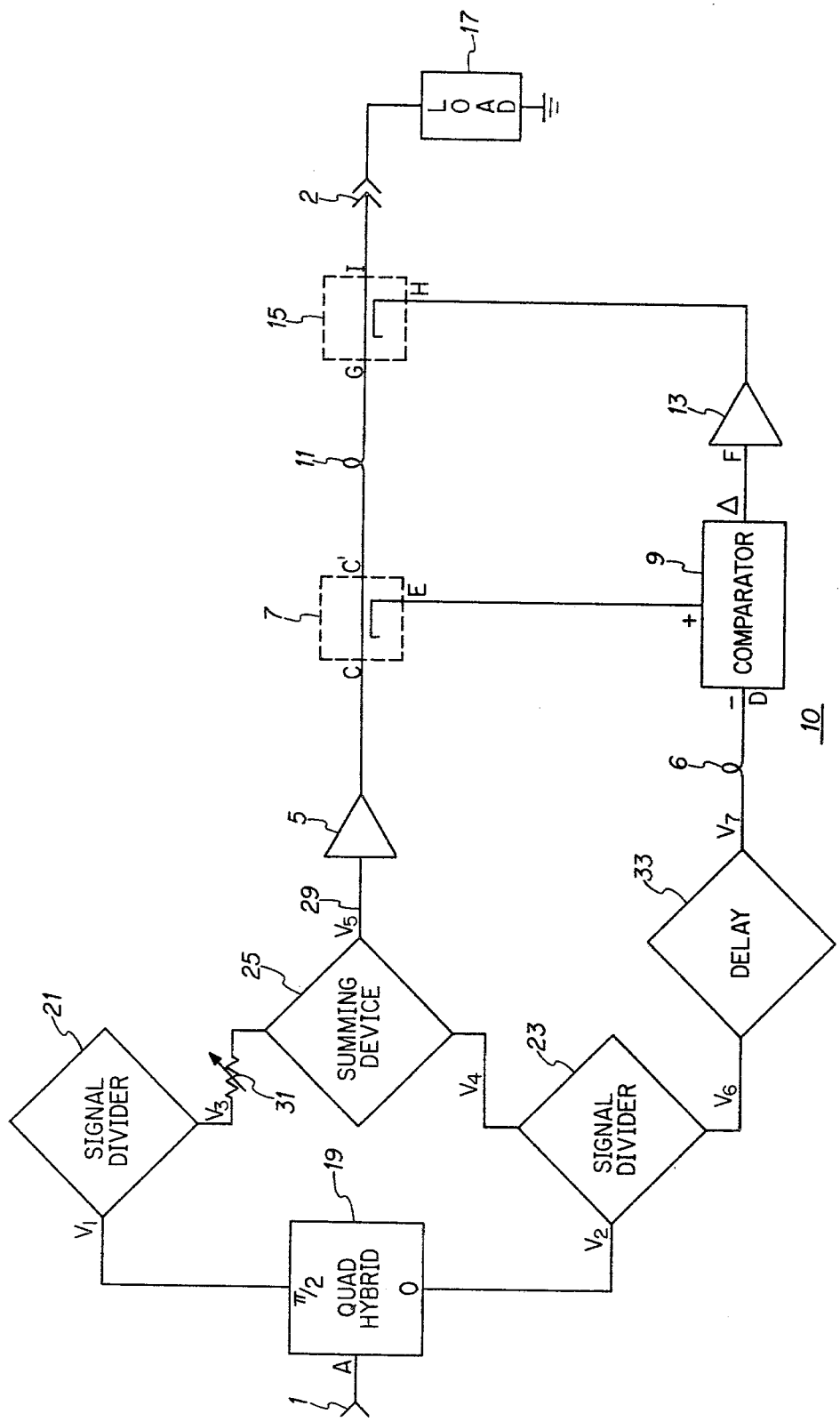
FIG. 3 is a feedforward amplifier circuit according to the invention.

In FIG. 3, to which reference should now be made, there is shown a feedforward amplifier circuit having incorporated therein a phase intercept distortion compensation network. The input signal is applied by way of terminal 1 to the quadrature hybrid 19 which is a Hilbert's transformer that splits the input signal into two signals $V_1$ and $V_2$. The signals $V_1$ and $V_2$ are of equal amplitude and have a phase quadrature relationship. The signal $V_1$ is applied to the signal divider 21 which divides $V_1$ into the internal port dissipator and attenuator 31 to provide a signal $V_3$ on its output terminal. The summing device 25 as well as the signal dividers 21 and 23 are hybrid junctions in the preferred embodiment and provide the capabilities of providing either the sum or the difference between the signals on their input terminals. Whether the sum or the difference output terminal is utilized would depend upon the amount of phase shift necessary to compensate for the phase offset as illustrated by arrows 49 in FIG. 2. Although the hybrid junction type devices are shown and utilized in the preferred embodiment, these same functions may be implemented by the use of resistor combination or resistors and operational amplifier combinations. The function performed by the devices 21, 23 and 25 which can be a single reciprocal device is essentially power division or summation, discussed in conjunction with the theory of operation.

The signal $V_2$ is in phase quadrature with the signal $V_1$ and applied to the signal divider 23. The two output signals provided by the signal divider 23 are $V_4$ and $V_6$. The signal $V_4$ is combined with the signal $V_3$ by the summing device 25 to obtain the signal $V_5$ on conductor 29. Power amplifier 5 amplifies the signal $V_5$ and applies it to the directional coupler 7 which samples the signal and provides a sample signal to the comparator 9 for summing with the output of the feedforward path which includes the time delay 33 and the delay line 6. The time delay that is represented by the delay 33 which is utilized to show that the time for the input signal present at terminal 1 to pass through the quadrature hybrid 19, the signal divider 23 and the delay line 33 is equal to the time for the signal as present on terminal 1 to pass through the quadrature hybrid device 19, the signal divider 21 and the summing device 25. The time delay as represented by the delay 33 could very easily be incorporated within the delay line 6 which in the preferred embodiment is the coaxial cable. The output from the comparator 9 which is the difference between the signal that was sampled by the directional coupler 7 that is present on terminal E and the signal that is present on the negative terminal D of the comparator is applied to the error amplifier 13 at terminal F and is recombined with the signal that is present on terminal C' of the directional coupler 7 by the recombiner 15 which is a directional coupler. Directional coupler 15 recombines the signal that is present on terminal C which has delayed by the delay line 11 in order to compensate for the propagation delay of the error signal as it passed through the error amplifier 13 to obtain a composite signal that is present on terminals I and 2 and is eventually applied to the load 17.

The selection of the attenuation of the variable attenuator 31 and the output terminals (either the sum or difference terminals) can provide any phase shift in the signal $V_5$ that will compensate for any characteristic phase intercept of the amplifier 5. The placement of the variable resistor may be on any of the input terminals of the summing device 25.

| TABLE OF EQUATIONS |
|---|
| 1. $V_A = K \sin \omega t$ |
| 2. $V_B = K \sqrt{\alpha_1} \sin \omega t$ |
| 3. $V_C = K \sqrt{G_1} \sin \omega(t - T_1) + D_{V_1}(t)$ |
| 4. $V_D = K \sqrt{\alpha_1 \alpha_3} \sin \omega(t - T_2)$ |
| 5. $V_E = K \sqrt{\alpha_2 G_1} \sin \omega(t - T_1) + \alpha_2 \cdot D_{V_1}(t)$ |

TABLE OF EQUATIONS

6. $$V_F = \sqrt{\alpha_5}\ (V_E - V_D)$$

7. $$V_F = K\sqrt{\alpha_2\alpha_5 G_1}\ \sin \omega(t - T_1) + \sqrt{\alpha_5\alpha_2}\ D_{V_1}(t) - K\sqrt{\alpha_1\alpha_3\alpha_5}\ \sin \omega(t - T_2)$$

8. $$V_G = K\sqrt{\alpha_4 G_1}\ \sin \omega(t - T_1 - T_3) + \sqrt{\alpha_4}\cdot D_{V_1}(t - T_3)$$

9. $$V_H = K\sqrt{\alpha_2\alpha_5 G_1 G_2}\ \sin \omega(t - T_1 - T_4) + D_{V_1}(t - T_4)\sqrt{\alpha_5\alpha_2 G_2} - K\sqrt{\alpha_1\alpha_3\alpha_5 G_2}\ \sin \omega(t - T_1 - T_4) + D_{V_2}(t)$$

10. $$V_I = \sqrt{\alpha_6}\cdot (V_G - V_H)$$

11. $$V_I = K\sqrt{G_1\alpha_4\alpha_6}\ \sin \omega(t - T_1 - T_3) + \sqrt{\alpha_4\alpha_6}\ D_{V_1}(t - T_3) - K\sqrt{\alpha_2\alpha_5\alpha_6 G_1 G_2}\ \sin \omega(t - T_1 - T_4) - \sqrt{\alpha_2\alpha_5\alpha_6 G_2} D_{V_1}(t - T_4) + K\sqrt{\alpha_1\alpha_3\alpha_5\alpha_6 G_2}\ \sin \omega(t - T_2 - T_4) - \sqrt{\alpha_6}\cdot D_{V_2}(t)$$

12. $$V_1 = \sqrt{\frac{K}{2}}\ \sin \omega(t) = \beta \sin \omega(t)$$

13. $$V_2 = \sqrt{\frac{K}{2}}\ \cos \omega(t) = \beta \cos \omega(t)$$

14. $$V_3 = \pm\sqrt{\frac{\beta}{2}}\ \sin \omega(t)$$

15. $$V_4 = \pm\sqrt{\frac{\beta}{2}}\ \cos \omega(t);\ V_6 = \mp\sqrt{\frac{\beta}{2}}\ \cos \omega(t)$$

16. $$V_5 = (\alpha V_3 + V_4)\sqrt{\frac{1}{2}}$$

17. $$\sqrt{2}\ V_5 = \alpha\left(\pm\sqrt{\frac{\beta}{2}}\ \sin \omega(t)\right) + \pm\sqrt{\frac{\beta}{2}}\ \cos \omega(t)$$

18. $$\sqrt{2V_5} = \alpha(\pm\beta'\sin \omega(t)) + (\beta'\cos \omega(t))\ \text{when}\ \beta' = \sqrt{\frac{\beta}{2}}$$

$$V_5 = \sqrt{\frac{\alpha}{2}}\ (\pm \beta'\sin \omega(t)) \pm \sqrt{\frac{\beta'}{2}}\ \cos \omega(t)$$

$$\text{let}\ \sqrt{\frac{\alpha\beta'}{2}} = q\ \sqrt{\frac{\beta'}{2}} = P$$

19. $$V_5 = \pm q \sin \omega(t) \pm p \cos \omega(t)$$

20. $$V_7 = \sqrt{\frac{V_6}{2}} = \mp P \cos \omega(t)$$

21. $$V_5 = \sqrt{p^2 + q^2}\ \sin(\omega t + \theta)\quad \text{(From H. B. Dwight, "Table of Integrals and Other Mathematical Data")}$$
where $\theta = \sin^{-1} \pm \frac{P}{\sqrt{p^2 + q^2}}$ 22. $$V_7 = \mp P \cos \omega(t) = \mp P \sin\left(\omega t + \frac{\pi}{2}\right)$$

23. $$\angle V_5 V_7 = \mp P \sin\left(\omega t + \frac{\pi}{2}\right)$$

$$= \frac{\pi}{2} - \sin^{-1}\frac{P}{\sqrt{p^2 + q^2}}\quad P = \sqrt{\frac{\beta'}{2}} = \frac{\beta}{2}$$

$$q = \alpha\sqrt{\frac{\beta'}{2}} = \frac{\alpha\beta}{2}$$

$$= \frac{\pi}{2} - \sin^{-1}\frac{\beta/2}{\sqrt{(\beta/2)^2 + \alpha^2(\beta/2)^2}}$$

$$= \frac{\pi}{2} - \sin^{-1}\sqrt{\frac{\pm 1}{1 + \alpha^2}}$$

$\alpha$ can vary from $0 \longrightarrow 1$

24. $$\sin^{-1}\frac{+1}{\sqrt{1 + \alpha^2}} = (\pi/2)\ \alpha = 0$$

$$\sin^{-1}\frac{-1}{\sqrt{1 + \alpha^2}} = (\pi/2)\ \alpha = 0$$

25. $$\sin^{-1}\frac{+1}{\sqrt{2}} = \pi/4,\ 3\pi/4$$

26. $$\sin^{-1}\frac{-1}{\sqrt{2}} = -\pi/4,\ -3\pi/4$$

27. if $\alpha = 1$, +sign, angle $= -\pi/4,\ \pi/4$ 28. if $\alpha = 1$, −sign, angle $= 3\pi/4,\ 5\pi/4$ Theory of the Operation Referring to the Table of Equations, Equation 12 is a mathematical representation of the signal $V_1$ and Equation 13 is a mathematical representation of $V_2$. By comparing the two equations, it is obvious that they are in phase quadrature and also the total power associated with each signal is one-half the power that was present in the input signal represented by Equation 1. The devices 21, 23 and 25 are esentially power dividers and as such the power associated with the voltage $V_3$ as represented by Equation 14 is divided in half and consequently, the voltage signal is divided by the square root of 2. Similarly, $V_4$ has associated with it one-half of the power of $V_2$. The summing device 25 sums either positive or negative signals $V_3$ and $V_4$. $V_3$ is attenuated by a multiplier $\alpha$ that is represented by the variable attenuator 31. The output of the summing device 25 is the voltage signal $V_5$ and is represented by Equation 16 and simplified in Equation 17, 18 and 19. $V_7$ is just a delay of the signal of $V_6$ with an attenuation factor associated with it as shown in Equation 20. Equations 21 and 22 are simplifications of the equations used to represent the signals $V_5$ and $V_7$. Equation 23 represents the angle between vectors $V_5$ and $V_7$. Equations 24, 25, 26, 27 and 28 illustrate for different values of $\alpha$ and the selection of the terminals of the summing devices that the phase angle of the characteristic response of the amplifier 5 can be varied by 360°.

Many changes and modifications in the above described embodiment of the invention can, of course, be carried out without departing from the scope thereof. Accordingly, to promote the progress in science and the useful arts, the invention is disclosed and is intended to be limited only by the scope of the appended claims.

I claim:

1. A feedforward wideband power amplifier for amplifying an electromagnetic wave signal, comprising:
    first signal path including in cascade arrangement, signal amplifier means for amplifying the electromagnetic wave signal and a first delay network;
    a second signal path including in cascade arrangement, a second delay network, summing device and an error amplifier;
    a phase intercept distortion compensation means for dividing the electromagnetic wave signal into two signals in phase quadrature with each other to obtain a first signal and a second signal, for matching the phase and amplitude of the first signal to the second signal and for applying the first signal to the first signal path and the second signal to the second signal path;
    a coupler means for coupling an amplified sample of the first signal to the one input terinal of the summing device; and
    recombiner means for recombining the output signal of the first signal path with the output signal of the second signal path.

2. The feedforward wideband power amplifier according to claim 1 wherein the phase intercept distortion compensation means comprises:
    a Hilbert's transform means for dividing the electromagnetic wave signal into an in-phase signal and a quadrature-phase signal;
    a first power divider means for dividing the power of the quadrature-phase signal;
    a second power divider means for dividing the in-phase signal into a first sample signal and a second sample signal;
    a combiner means for combining the divided quadrature-phase signal with the first sample signal and for applying the combined signal to the first signal path; and
    means for coupling the second sample signal to the second signal path.

3. The feedforward wideband power amplifier according to claim 2 further comprising:
    means for attenuating the divided quadrature-phase signal.

4. The feedforward wideband power amplifier circuit according to claim 2 further comprising:
    an attenuation means for attenuating the first sample signal.

5. A method for providing phase intercept distortion compensation to a feedforward wideband power amplifier that has a first signal path including, in cascade arrangement, a signal amplifier and a first delay network, and a second signal path including, in cascade arrangement, a second delay network, summing device and an error amplifier; the method comprises the steps of:
    dividing the input signal into two signals in phase quadrature with each other to obtain a first signal and a second signal;
    matching the phase and the amplitude of the first signal to the second signal;
    applying the first signal to the first signal path;
    applying the second signal to the second signal path;
    coupling an amplified sample of the first signal to one input terminal of the summing device; and
    recombining the output signal of the first signal path with the output signal of the second path.

6. The method according to claim 5 wherein the step of dividing the input signal into two signals in phase quadrature with each other and matching the phase and amplitude of the first signal to the second signal comprise:
    dividing the input signal into an in-phase signal and a quadrature-phase signal;
    dividing the power of the quadrature-phase signal;
    dividing the in-phase signal into a first sample signal and a second sample signal;
    combining the divided quadrature-phase signal with the first sample signal;
    applying the recombined signal to the first signal path; and
    coupling the second sample signal to the second signal path.

* * * * *